(12) United States Patent
Lee (10) Patent No.: US 10,840,372 B2
(45) Date of Patent: Nov. 17, 2020

(54) SOI POWER LDMOS DEVICE

(71) Applicant: Texas Instruments Incorporated, Dallas, TX (US)

(72) Inventor: Zachary K. Lee, Fremont, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 7 days.

(21) Appl. No.: 15/864,865

(22) Filed: Jan. 8, 2018

(65) Prior Publication Data

US 2018/0151725 A1   May 31, 2018

Related U.S. Application Data

(62) Division of application No. 15/009,017, filed on Jan. 28, 2016, now Pat. No. 9,905,688.

(51) Int. Cl.

| | |
|---|---|
| H01L 29/66 | (2006.01) |
| H01L 29/78 | (2006.01) |
| H01L 29/10 | (2006.01) |
| H01L 27/12 | (2006.01) |
| H01L 21/84 | (2006.01) |
| H01L 29/40 | (2006.01) |
| H01L 29/06 | (2006.01) |

(Continued)

(52) U.S. Cl.
CPC ......... *H01L 29/7824* (2013.01); *H01L 21/84* (2013.01); *H01L 27/1203* (2013.01); *H01L 29/1045* (2013.01); *H01L 29/1083* (2013.01); *H01L 29/404* (2013.01); *H01L 29/66659* (2013.01); *H01L 29/66681* (2013.01); *H01L 29/7817* (2013.01); *H01L 29/7835* (2013.01); *H01L 21/823892* (2013.01); *H01L 29/063* (2013.01); *H01L 29/0653* (2013.01); *H01L 29/0692* (2013.01); *H01L 29/0847* (2013.01)

(58) Field of Classification Search
CPC ............ H01L 29/7824; H01L 29/1045; H01L 29/66681; H01L 29/7817; H01L 23/3675; H01L 23/3121; H01L 23/3735; H01L 23/4334; H01L 21/565; H01L 21/4871; H01L 21/84
See application file for complete search history.

(56) References Cited

U.S. PATENT DOCUMENTS 6,468,878 B1 * 10/2002 Petruzzello ........... H01L 29/402
438/454
7,576,387 B2 * 8/2009 Theeuwen ............ H01L 29/402
257/328

(Continued)

*Primary Examiner* — Nathan W Ha
(74) *Attorney, Agent, or Firm* — Andrew R. Ralston; Charles A. Brill; Frank D. Cimino (57) ABSTRACT

An LDMOS device includes a handle portion having a buried dielectric layer and a semiconductor layer thereon doped a second dopant type. A drift region doped a first type is within the semiconductor layer providing a drain extension. A gate stack includes a gate electrode on a gate dielectric layer on respective sides of a junction with the drift region. A DWELL region is within the semiconductor layer. A source region doped the first type is within the DWELL region. A drain region doped the first type is within the drift region. A first partial buried layer doped the second type is in a first portion of the drift region including under the gate electrode. A second partial buried layer doped the first type is in a second portion of the drift region including under the drain.

23 Claims, 5 Drawing Sheets

(51) Int. Cl.
    *H01L 29/08*        (2006.01)
    *H01L 21/8238*      (2006.01)

(56)            References Cited

U.S. PATENT DOCUMENTS

| | | | |
|---|---|---|---|
| 8,124,482 | B2 | 2/2012 | Denison et al. |
| 8,138,049 | B2 | 3/2012 | You |
| 8,253,193 | B2 | 8/2012 | Denison et al. |
| 8,274,129 | B2 | 9/2012 | French et al. |
| 9,461,046 | B1 | 10/2016 | Edwards et al. |
| 2003/0107086 | A1* | 6/2003 | Letavic ............... H01L 29/7824 257/367 |
| 2004/0201078 | A1* | 10/2004 | Ren ....................... H01L 29/402 257/500 |
| 2006/0017105 | A1 | 1/2006 | Ogura et al. |
| 2007/0069292 | A1 | 3/2007 | Yamada |
| 2011/0073904 | A1 | 3/2011 | Ashida et al. |
| 2011/0127602 | A1 | 6/2011 | Mallikarjunaswamy |
| 2012/0112280 | A1 | 5/2012 | Johnson et al. |
| 2013/0270606 | A1 | 10/2013 | Chen et al. |
| 2014/0035032 | A1 | 2/2014 | Korek et al. |
| 2014/0284701 | A1* | 9/2014 | Korec ................. H01L 29/7824 257/328 |
| 2015/0380398 | A1 | 12/2015 | Millikarjunaswamy |
| 2016/0181422 | A1 | 6/2016 | Chiang et al. |
| 2016/0240668 | A1 | 8/2016 | Tsai et al. |

\* cited by examiner

SOI POWER LDMOS DEVICE

CROSS REFERENCE TO RELATED APPLICATIONS

Pursuant to 35 U.S.C. § 120, this divisional application claims the benefit of and priority to U.S. patent application Ser. No. 15/009,017 (TI-76316), filed on Jan. 28, 2016, now U.S. Pat. No. 9,905,688, the entirety of which is hereby incorporated herein by reference.

FIELD

Disclosed embodiments relate to semiconductor on insulator (SOI) laterally diffused metal-oxide-semiconductor (LDMOS) devices.

BACKGROUND

SOI is a semiconductor technology that produces higher performing, lower power (dynamic) devices as compared to traditional bulk silicon-based technology. SOI functions by placing a thin, dielectric (electrically insulating) layer, such as silicon oxide or glass, between a thin top layer of a semiconductor material such as silicon and a supporting handle portion that is generally a silicon substrate.

Power integrated circuits (ICs) have gained importance due to their advantages of small size, low cost, lower power consumption, and increased reliability. Power ICs operating in the low to medium voltage range (e.g., 30 V to 120 V) are used in applications such as automotive electronics, light-emitting diode drivers, plasma display panels, PC peripheral, and portable power management products. Low ON-resistance is often achieved through a reduced surface field (RESURF) structure in the LDMOS device design. The RESURF structure is designed to deplete the drift space of the LDMOS device in both vertical and lateral directions, thereby reducing the electric field near the surface at the drift region and thus raising the OFF-state breakdown voltage (BVdss) of the device.

SOI is known for power ICs such as LDMOS devices because SOI provides superior electrical isolation between various devices on the chip as well as better performance. In an LDMOS device, the drain is laterally arranged to allow current to laterally flow, and a drift region is interposed between the channel and the drain to provide a high drain to source BV. LDMOS devices are thus generally designed to achieve higher BV while minimizing specific ON-resistance in order to reduce conduction power losses.

The specific on-resistance (RON) is defined as the product of total ON-resistance and area of the device. Both the voltage breakdown voltage (VBR) and the ON-resistance of SOI LDMOS are dependent on the length and doping of the drift region. A long drift region length and low doping is generally needed to achieve high breakdown voltage in a conventional LDMOS device, which unfortunately, increases the ON-resistance of the device. Conversely, a shorter drift region length with higher a doping level reduces the ON-resistance, but adversely affects the breakdown voltage. Therefore, there is generally always a trade-off between the breakdown voltage and the ON-resistance.

SUMMARY

This Summary is provided to introduce a brief selection of disclosed concepts in a simplified form that are further described below in the Detailed Description including the drawings provided. This Summary is not intended to limit the claimed subject matter's scope.

Under normal semiconductor on insulator (SOI) laterally diffused metal-oxide-semiconductor (LDMOS) device operation, a bias is applied to the device terminals formed in the semiconductor layer above the buried oxide (BOX) layer of the LDMOS device, with the handle portion physically below the BOX layer at 0 V (ground), which sets up a differential device-to-handle voltage (DDH voltage) between the LDMOS device terminals and the handle portion. Disclosed embodiments recognize for high voltage SOI LDMOS or drain-extended MOS devices having a typical operating voltage range of about 85V and above, the DDH voltage can significantly affect the breakdown voltage (BV) and drive current of the LDMOS device. This results because the handle portion voltage with respect to the voltage on the LDMOS device terminals can affect the depletion region associated with the drift region. As used herein, an LDMOS device is synonymous with a diffused (or drain extended) metal oxide semiconductor (DMOS) device and includes both n-channel LDMOS (NLDMOS) and p-channel PLDMOS devices. One known design to address this DDH voltage problem is to use a lightly doped drift region, sometimes combined with field plates. However, this known design is recognized to have the disadvantage of high Rsp, low Idsat, and quasi-saturation problems.

The LDMOS device structures described herein include a partial buried layer of both n-type as well as a partial buried layer of p-type, including one of these partial buried layers of opposite doping type to that of the drift region including under a portion of the gate electrode. Such a partial buried layer arrangement has been found to minimize the DDH voltage sensitivity such that the LDMOS device can operate without significant degradation of BV such that the device can be made to provide good Rsp, Idsat, and minimize quasi-saturation effects under a wide range of DDH voltage conditions. As a result, for disclosed LDMOS devices including a partial buried layer of opposite type to that of the drift region under a portion of the gate electrode, the reduced resurf effect in negative DDH conditions (e.g., below ground device voltage referenced to a grounded handle in NLDMOS) and in positive DDH (high-side situations) in PLDMOS (e.g., the PLDMOS source voltage above the handle portion potential) due to the DDH voltage can be compensated for.

Working in conjunction with optional disclosed staggered field plates (constructed using one or more of various backend metal levels metal 1 (M1), metal 2 (M2) . . . and the gate electrode) the LDMOS device can become further DDH voltage invariant as the partial buried layer and staggered field plate structures complement one another. LDMOS devices having various operating condition requirements with respect to the DDH voltage using disclosed different partial buried layer arrangements along with optional staggered FPs can therefore be designed and integrated on the same IC die using the same drift region doping concentration profile across the die.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1:
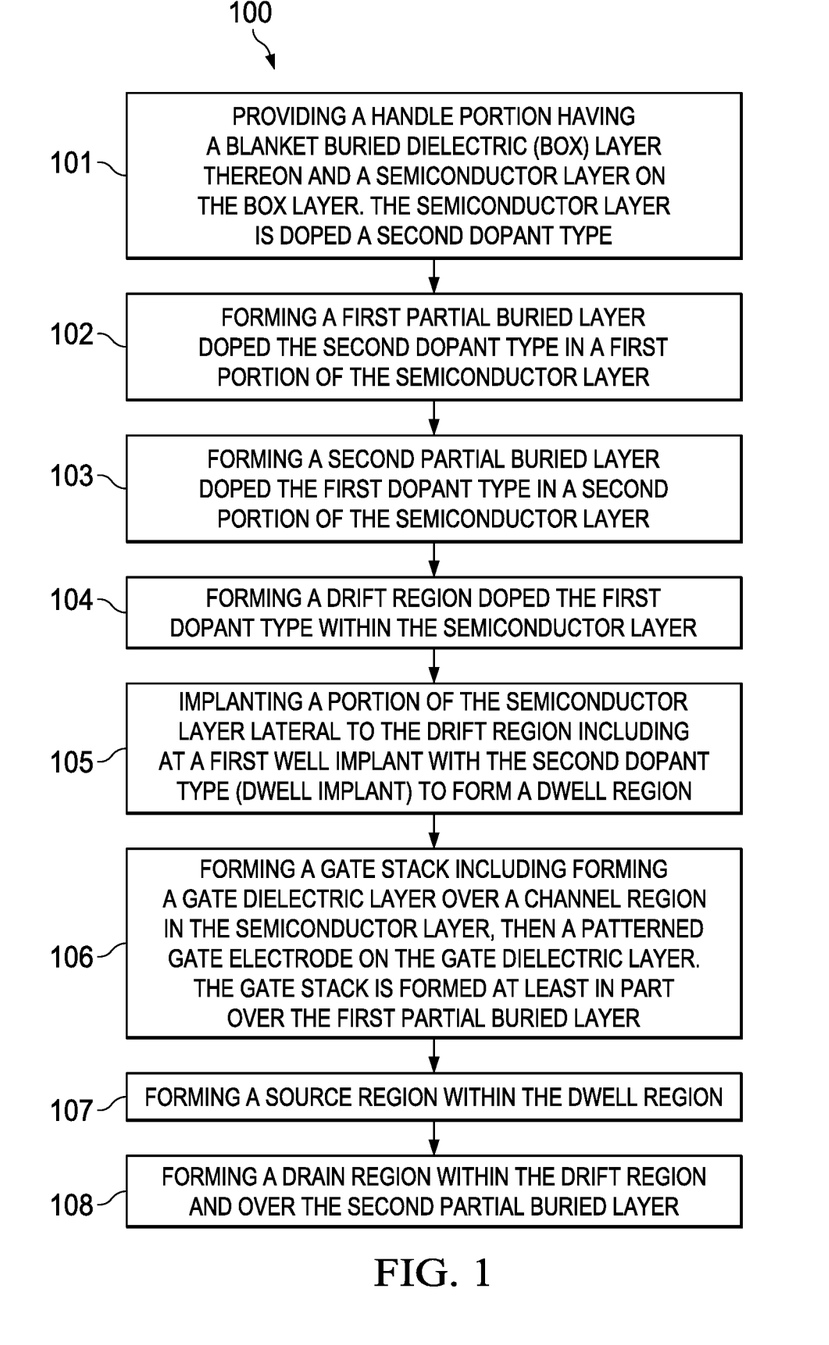
FIG. 1 is a flow chart that shows steps in an example method for forming an SOI laterally LDMOS device having a first partial buried layer and a second partial buried layer, according to an example embodiment.
Figure 2:
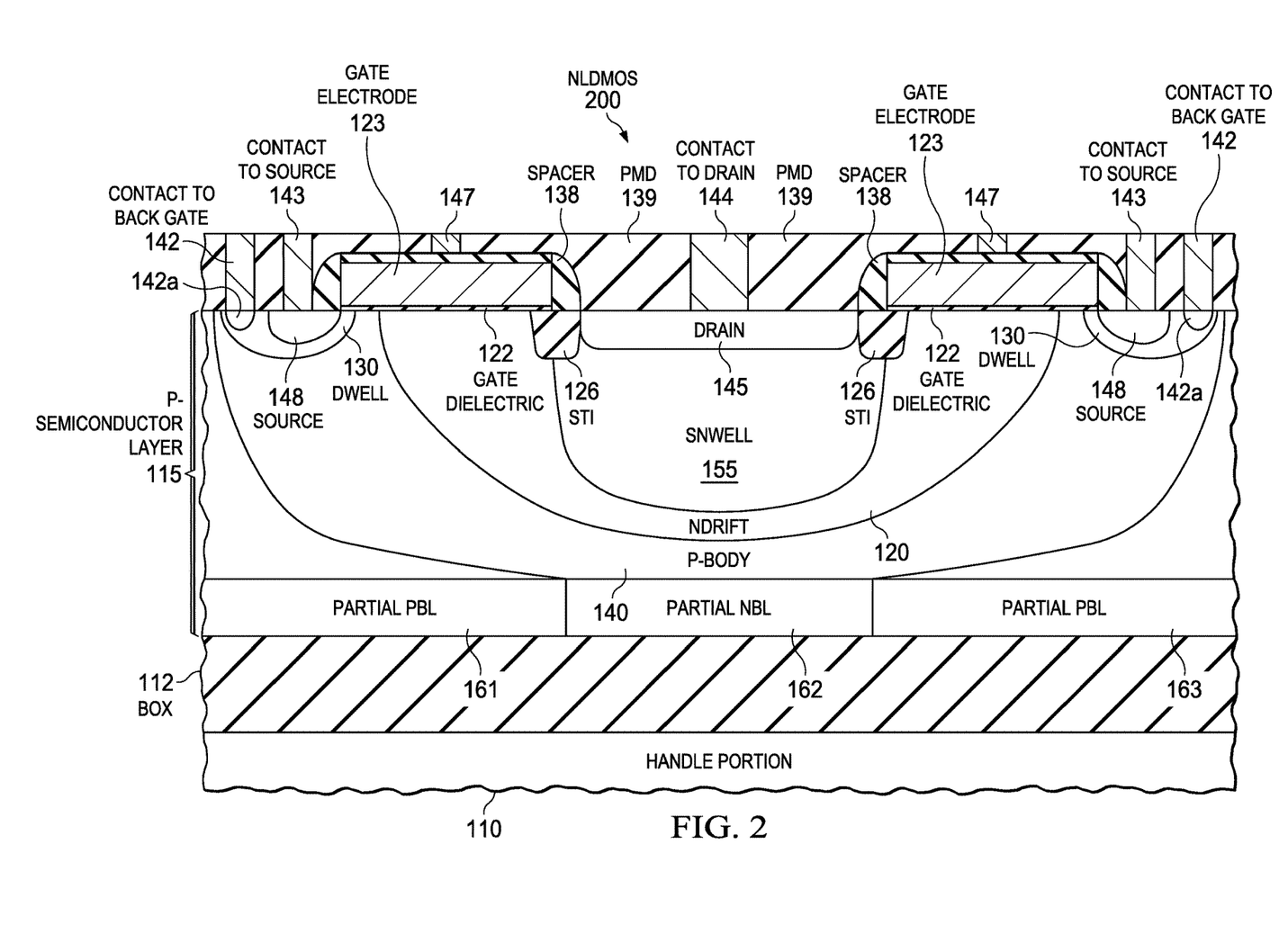
FIG. 2 is a cross sectional depiction of an example disclosed SOI NLDMOS device having first and second partial buried layers, according to an example embodiment.

FIG. 1 is a flow chart that shows steps in an example method 100 for forming an SOI LDMOS device having a first partial buried layer and a second partial buried layer, according to an example embodiment. FIG. 2 is a cross sectional depiction of an example disclosed NLDMOS device 200 having first partial buried layer shown as partial PBL 161 and a second partial buried layer shown as partial NBL 162, according to an example embodiment. Although an NLDMOS device 200 is shown in FIG. 2 and is generally described herein, it should be clear to one having ordinary skill in the art to use this information to form PLDMOS transistors by n-doped regions being substituted by p-doped regions and vice versa, so for example the pbody region for the NLDMOS device 200 would be an nbody region for a PLDMOS device.

Step 101 comprises providing a handle portion 110 having a blanket buried dielectric (BOX) layer 112 thereon and a semiconductor layer 115 on the BOX layer 112 as shown in FIG. 2. The semiconductor layer 115 is doped a second dopant type (a p-semiconductor layer 115 (or pwell region) for NLDMOS device 200 and an n-semiconductor layer 115 (or nwell region) for a PLDMOS device. The BOX layer 112 has a typical thickness range from 0.5 μm to 4 μm, such as a thickness about 2 μm. The handle portion 110 can comprise silicon or other material, and the BOX layer 112 can comprise silicon oxide. The semiconductor layer 115 can comprise silicon-germanium, or other semiconductor material. The semiconductor layer 115 can range inn thickness from 1 μm to 9 μms, typically being 4 μm to 5 μm thick. The doping level in the semiconductor layer 115 can be between $5 \times 10^{13}$ cm$^{-3}$ and $5 \times 10^{15}$ cm$^{-3}$, is generally around $1 \times 10^{15}$ cm$^{-3}$.

Step 102 comprises forming a first partial buried layer doped the second dopant type in a first portion of the semiconductor layer 115. The p-type doping of partial PBL 161 in FIG. 2 is opposite that the doping type in the drift region shown as ndrift region 120. As shown in FIG. 2, the ndrift region 120 is formed within the pbody region 140 which is itself formed within a portion of the semiconductor layer 115. The pbody region 140 can be a portion of the semiconductor layer 115 without any doping modification, or can be formed from one or more ion implants into a portion of the semiconductor layer 115.

Step 103 comprises forming a second partial buried layer doped the first dopant type in a second portion of the semiconductor layer 115. The second partial buried layer shown as partial NBL 162 in FIG. 2 has a doping type that is the same as the doping type in the drift region shown as ndrift region 120. Typical partial buried layers each occupy about one half (½) the length of the drift region, both being within a range from 10% to 90% so that they total a little over 100% (a small overlap). It is recognized if the partial buried layer (partial PBL 161 for NLDMOS) goes over the entire drift region 120 then there will be a junction BV limitation between the partial buried layer and the drift region near the drain, which also increases the drain junction capacitance.

In one embodiment the semiconductor layer 115 is the result of growing an epitaxial layer on a thin semiconductor layer on the BOX layer 112 after forming the buried layers (steps 102, 103). In this embodiment, the starting semiconductor layer thickness is generally from 0.5 μm to 2.5 μm, and at the end of the epitaxial deposition process the thickness of the semiconductor layer 115 is from 1 μm to 9 μm thick, typically being 4 μm to 5 μm thick.

As used herein, a "partial buried layer" has at least a 2 times (2×) higher doping concentration as compared to the doping level in the semiconductor layer 115, typically being 10× higher, and the partial buried layer has a doping range from $1 \times 10^{15}$ cm$^{-3}$ to $1 \times 10^{18}$ cm$^{-3}$, such as between $1 \times 10^{16}$ cm$^{-3}$ and $3 \times 10^{16}$ cm$^{-3}$. Disclosed partial buried layers also have a minimum 0.5 μm depth from the top surface of the semiconductor layer 115. A typical depth of the partial buried layer from the top surface of the semiconductor layer 115 is 50% of semiconductor layer 115 thickness, such as being 2 μm from the top surface when the semiconductor layer 115 thickness is 4 μm.

The partial buried layers 161, 162 are generally both generally formed by ion implantation. In one embodiment, the first partial buried layer shown as partial PBL 161 in FIG. 2 is a blanket layer and the second partial buried layer shown as partial NBL 162 in FIG. 2 is a localized layer having a doping level sufficiently high to counterdope a doping level in the first partial buried layer. In another embodiment, the second partial buried layer is a blanket layer and the first partial buried layer is a localized layer having a doping level sufficiently high to counterdope a doping level in the second partial buried layer. In yet another embodiment, the first partial buried layer and second partial buried layer are both patterned layers. The partial buried layers can also be "diluted" by having dithering in the implant mask, so that the concentration at the partial buried layer junction (e.g. partial PBL 161/partial NBL 162) is graded to improve the BV.

Step 104 comprises forming a drift region doped the first dopant type within the semiconductor layer 115. As noted above the drift region provides the drain extension, such as ndrift region 120 shown in FIG. 2 providing the drain extension region for NLDMOS device 200. Ion implantation is generally used to form the drift region.

The implants in step 102, step 103 and step 104 can generally be performed be in any order. The method can also include a rapid thermal anneal (RTA) damage anneal after all of these implants to heal the implant-induced lattice damage. In addition, after step 104 a shallow nwell (SNW) or shallow pwell (SPW) may also be formed. A SNW is shown in FIG. 2 as SNWell 155. However, a SNW and SPW may also be formed after STI and DTI steps.

Figure 3:
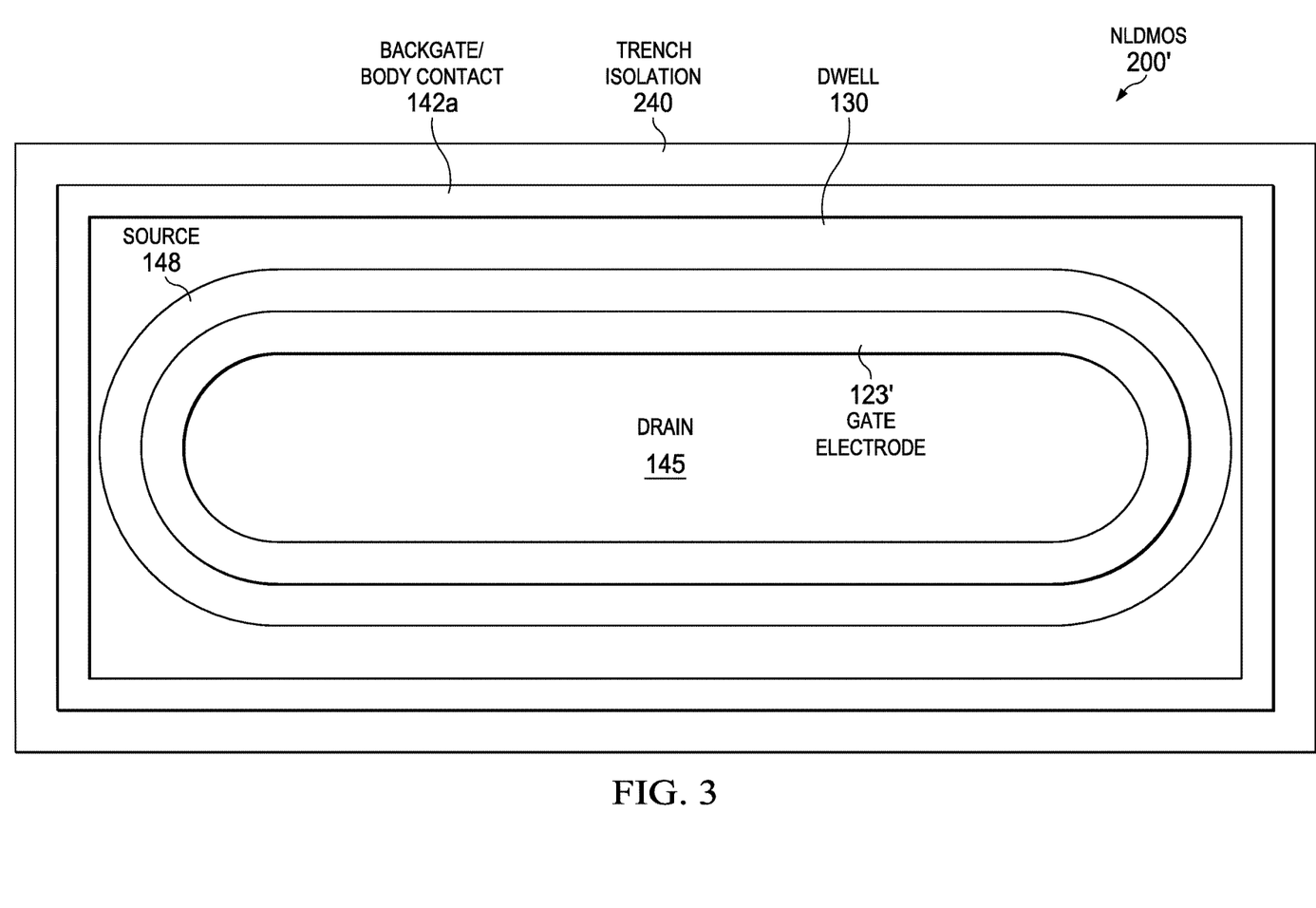
FIG. 3 is a top view of example SOI LDMOS device having first and second partial buried layers, where the gate electrode is in a racetrack configuration, according to an example embodiment.

Trench isolation such as shallow trench isolation (STI) or deep trench isolation (DTI) is then after step 104 generally then formed by etching (e.g., DRIE) and then a trench filling process. STI 126 is shown in FIG. 2. FIG. 3 described below shows a DTI tank 240. The DTI extends to the top of the BOX layer 112. However, the DTI or STI can be performed before or after forming of the drift region (step 104). In the case of STI, much of the drift region is generally under the STI.

Step 105 comprises implanting a portion of the semiconductor layer 115 lateral to the drift region 120 including at least a first well implant comprising the second dopant type (DWELL implant) into the semiconductor layer to form a DWELL region 130. In FIG. 2 the DWELL region 130 is shown formed in the pbody region 140. The DWELL in the case of a p-type region for NLDMOS 200 can comprise a plurality (or chain) of boron implants with different doses and energies ranging from 20 KeV to 2 MeV, and with doses ranging from $3.0 \times 10^{12}$ cm$^{-2}$ and $3.0 \times 10^{14}$ cm$^{-2}$, and a tilt angle of less than 5 degrees, such as 2 degrees, may be used.

Step 106 comprises forming a gate stack including forming a gate dielectric layer shown as gate dielectric layer 122 in FIG. 2 over a channel region in the semiconductor layer 115 adjacent to and on respective sides of a junction with the drift region shown as ndrift region 120 in FIG. 2, then a patterned gate electrode shown as gate electrode 123 on the gate dielectric layer 122 in FIG. 2. The gate stack is formed at least in part over the first partial buried layer shown as partial PBL 161 in FIG. 2.

The gate dielectric layer 122 can be a 5V gate dielectric comprising silicon oxide, which is about 10 to 15 nm thick. It is also possible to use a gate dielectric layer 122 as thin as about 3 nm of silicon dioxide, or a silicon oxynitride (SION)) gate dielectric that is slightly thinner but with a higher dielectric constant than that of silicon dioxide which is about 3.9. Polysilicon is one example gate electrode material for the gate electrode 123. However, a metal gate or CMOS-based replacement gate process can also be used to provide the gate electrode.

Sidewall spacers shown as 138 in FIG. 2 are generally formed on sidewalls of the gate electrode 123. A thin layer of the spacer material is also optionally shown in FIG. 2 on top of the gate electrode 123. The spacer material being on top of the gate electrode 123 shown in FIG. 2 may or may not be present. In one embodiment the sidewall spacers 138 comprise silicon nitride. A premetal dielectric (PMD) 139 is shown in FIG. 2 including over the spacers 138.

Step 107 comprises forming a source region shown as 148 in FIG. 2 within the DWELL region 130. Step 108 comprises forming a drain region shown as 145 in FIG. 2 within the drift region shown as ndrift region 120 in FIG. 2 and over the second partial buried layer shown as partial NBL 162 in FIG. 2. Contact (e.g., optional silicide, PMD 139, and vias) and metallization processing generally follow, including as shown in FIG. 2 contact to back gate 142 which contacts DWELL region 130, a contact to the source 143, a contact to drain 144, and a contact to the gate 147.

FIG. 3 is a top view of an example NLDMOS device 200' having first and second partial buried layers, where the gate electrode 123' is in a racetrack configuration, according to an example embodiment. Although not visible in this top view, the first partial buried layer shown as partial PBL 161 in FIG. 2 is in a first portion of the ndrift region 120 including under at least a portion of the gate electrode 123'. A second partial buried layer shown as partial NBL 162 in FIG. 2 is in a second portion of the ndrift region 120 including under the drain 145. A trench isolation 240 is shown framing NLDMOS device 200' which can comprise dielectric trench isolation such as DTI which extends to a top of the BOX layer 112. Trench isolation 240 can comprise DTI alone or DTI lying within STI.

The backgate/body contact region is shown as 142a is an integrated backgate contact, which is at the surface of the Dwell region 130. The backgate/body contact region 142a can be formed within the DWELL region 130 by adding a p+ SD (PSD) implant used for the CMOS section, which is very heavily (p+) boron doped. One arrangement has a plurality of backgate PSD stripes or squares in conventional geometries, with an NSD implant covering areas of the source/backgate region not covered with the PSD for low resistance contact to the source 148. Backgate/body contact region 142a allows the p-type body region (Dwell region 130 and pbody region 140) to be ohmically shorted to the source 148 doped n+ through a silicide layer.

Disclosed LDMOS devices generally also include at least one FP. The metal FPs of disclosed staggered FPs are generally connected to the source with an optional connection also to the body, but alternatively can also be connected to any node having a fixed voltage as long as the voltage on the FPs<voltage on the drain (on NLDMOS), with opposite polarity for PLDMOS. One can use absolute values, i.e., voltage on FP|<|voltage on drain|. When the gate electrode is used as one of the FPs it is tied to another fixed potential (gate bias). Disclosed staggered FPs reduce the electric field between the gate and drain terminals, subsequently forming a FP induced depletion region and reducing the leakage current or increasing the BV to significantly improve the power output provided by the LDMOS device.

Disclosed staggered FP arrangements provide a high average electric field across the entire length of the drift region shown as ndrift region 120 in FIG. 2 to enable a higher BV to be achieved. The FPs also help deplete the drift region to enable a higher doping concentration to be used, thereby reducing Rdson for the LDMOS device.

Figure 4A:
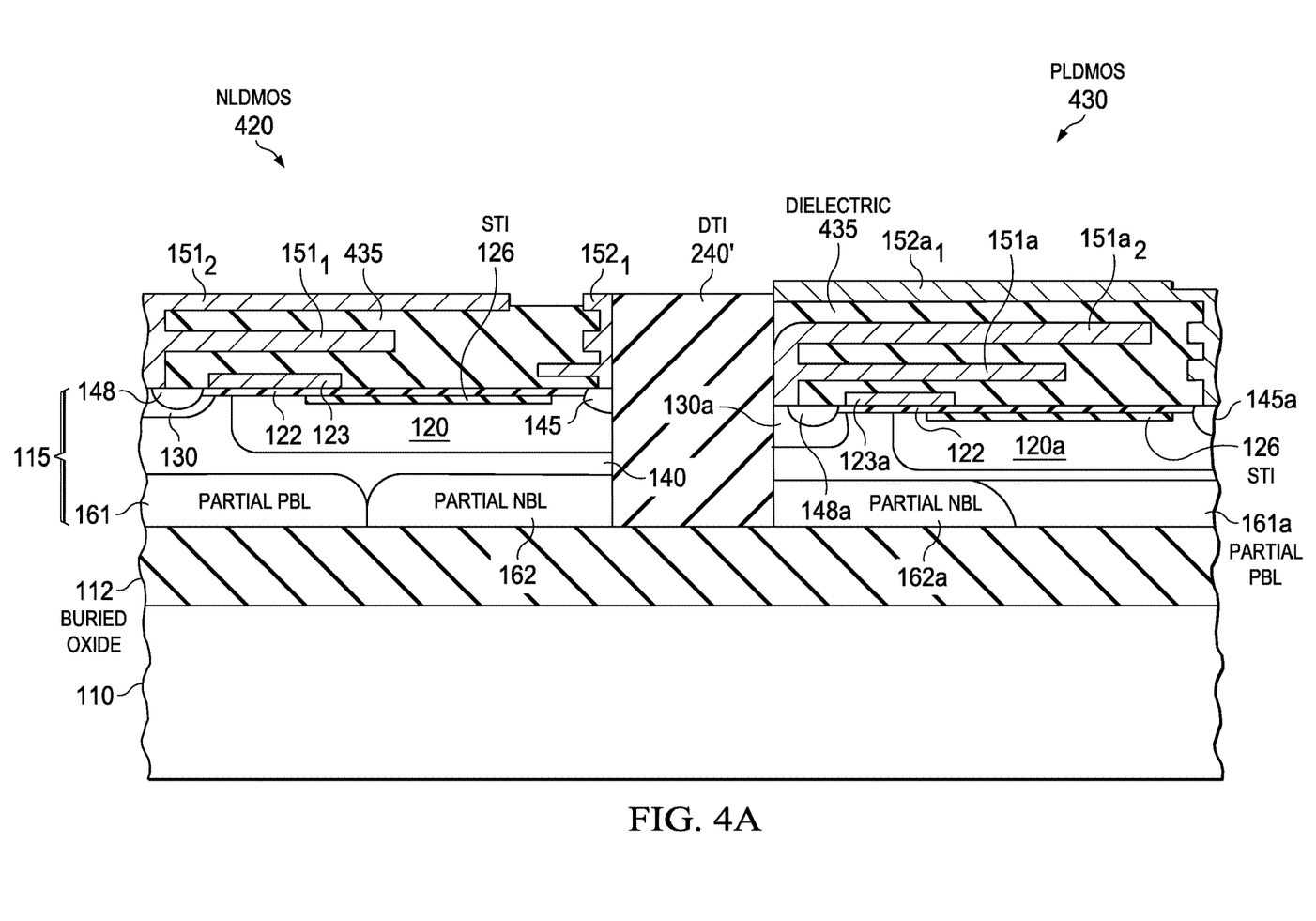
FIG. 4A is a cross sectional depiction of a die showing an example NLDMOS device and PLDMOS device each shown as half-devices on a common die designed for positive DDH voltages having disclosed partial buried layers arrangements and disclosed staggered FP arrangements, according to an example embodiment.
Figure 4B:
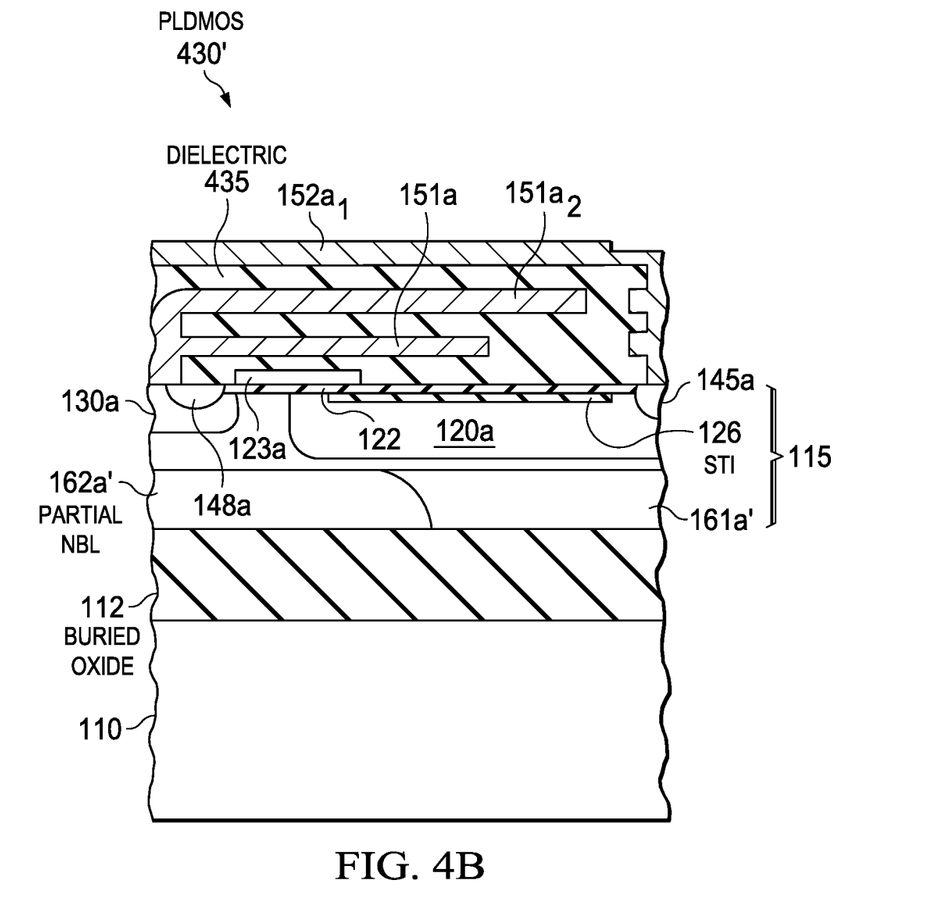
FIG. 4B is a cross sectional depiction of a die showing an example PLDMOS device shown a half-device designed for negative DDH voltages having disclosed partial buried layers arrangements and a disclosed staggered FP arrangement, according to an example embodiment.

The typical number of FPs is 2 to 3, with a range of 1 to 6 (or more). The respective FPs can be selected from the gate electrode 123 and the back-end metal levels (e.g., M1, M2, M3 . . . ). Staggered FPs as used herein refers to each FP overlapping a larger portion of the drift region shown as ndrift region 120 in FIG. 2 as its vertical distance to the drift region 120 increases, such as shown in FIGS. 4A and 4B described below. Regarding typical disclosed staggered FP positioning, for each level increase (polysilicon gate or metal), the increase in x is 6 times an increase in y, with a range between 1.2 times to 10 times (e.g., a M2 FPs extension relative to a M1 FP is 1.2 times to 10 times the ILD oxide thickness between M2 and M1. For an ILD thickness of 0.5 µm, using a 6 times increase/overhang, the M2 FP extends laterally 3 µm beyond the M1 FP.

FIG. 4A is a cross sectional depiction including an NLDMOS device 420 and PLDMOS device 430 each shown as half-devices on a semiconductor layer 115 on a BOX layer 112 on a handle portion 110, each having disclosed staggered FPs, according to example embodiments. The NLDMOS device 420 and PLDMOS device 430 are shown isolated from one another by DTI 240' and are each designed for positive DDH voltages (positive LDMOS device voltages with respect to the handle portion 110). STI 126 is shown in FIG. 4A.

NLDMOS device 420 has a source 148 in DWELL region 130, a drain 145 and gate 123. PLDMOS device 430 has a source 148a in DWELL region 130a, a drain 145a and gate 123a. NLDMOS device 420 has an ndrift region 120, and partial PBL 161 and partial NBL 162, while PLDMOS device 430 has a pdrift region 120a, partial PBL 161a and partial NBL 162a. For its contact to its drain 145 NLDMOS device 420 has a multi-layer contact to the drain $152_1$, while for its contact to its drain 145a, PLDMOS device 420 has a multi-layer contact to the drain $152a_1$ including contacts, vias and the multiple levels of metal interconnect as shown.

The staggered FPs for the NLDMOS device 420 are shown gate 123, $151_1$ (M1), and $151_2$ (M2). Here, the gate 123 is part of the staggered FP system, but as noted above is separated biased. The staggered FPs for the PLDMOS device 430 are different compared to the staggered FPs for the NLDMOS device 420 and are shown as gate 123a, $151a_1$ (M1), and $151a_2$ (M2). Again, gate electrode 123a is part of the staggered FP system. The PMD layer and ILD layers are collectively shown as dielectric 435.

FIG. 4B is a cross sectional depiction showing a PLDMOS device 430' shown as a half-device designed for negative DDH (negative device voltages with respect to VH=0) that can be seen to have a partial NBL shown as 162a' now only occupying about 50% of the area of the drift region 120a. The FPs are shown unchanged. STI 126 is also shown in FIG. 4B. The partial PBL is shown as 161a' now occupying about 50% of the area of the drift region 120a. PLDMOS device 430' can be integrated on the same die as PLDMOS device 430.

Working in conjunction with the FPs disclosed LDMOS devices can be designed having reduced DDH voltage sensitivity within a certain operating voltage range by choosing an appropriate overlap of the partial-buried layers with respect to the drift region. For example, if NLDMOS 420 operates at biases only above that of the handle portion 110 (positive DDH), the partial PBL 161 can overlap approximately half (50%) of the ndrift region 120 (defined as the drift region area underneath the dielectric 435). Although dielectric 435 is not shown demarcated, there can be STI within the semiconductor layer 115 that extends below the gate 123a. This prevents breakdown between partial PBL 161 and the drain 145 and also reduces the RON as well as providing reduced quasi-saturation effects (see, for example, FIG. 4A showing about a 50% overlap). On the other hand, if an NLDMOS device is to operate at biases below that of the handle portion 110, then the partial PBL 161 can be designed to overlap most (e.g., >80% of the drift region (defined as the region underneath dielectric 435 (e.g., under STI) in order to provide the needed resurf effect to avoid breakdown under these negative (DDH bias conditions.

This same principle also applies to PLDMOS devices. In FIG. 4A PLDMOS device 430 is intended for positive DDH operation with its source voltage above that of the handle portion 110 due to the reduced resurf effect encountered by a PLDMOS when operating with its source above the handle portion potential. On the other hand, if the PLDMOS device is needed for negative DDH voltages (the source voltage below that of the handle portion 110), the partial NBL 162' shown in FIG. 4B only overlaps about half (50%) of the drift region area under dielectric 435 to exploit the resurf effect provided by the handle portion, thus lowering RON and improving quasi-saturation. Therefore, as noted above, LDMOS devices having various DDH operating condition requirements can be designed and integrated on the same IC die using the same drift region doping concentration profile.

Disclosed embodiments can be used to form semiconductor die and integrated that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure. For example, high voltage diodes and high voltage bipolar transistors can also benefit from disclosed embodiments.

The invention claimed is:

1. A laterally diffused metal oxide semiconductor (LDMOS) device, comprising:
a handle portion having a blanket buried dielectric (BOX) layer thereon and a semiconductor layer on said BOX layer, said semiconductor layer doped a second dopant type;
a drift region doped a first dopant type within said semiconductor layer to provide a drain extension region;
a gate stack including a gate dielectric layer and a patterned gate electrode on said gate dielectric layer, said gate dielectric layer being located over a channel portion of said semiconductor layer adjacent to and on respective sides of a junction with said drift region;
a DWELL region within said semiconductor layer;
a source region doped said first dopant type within said DWELL region;
a drain region doped said first dopant type within said drift region;
a first partial buried layer doped said second dopant type in a first portion of said semiconductor layer including under at least a portion of said gate electrode;
a second partial buried layer doped said first dopant type in a second portion of said semiconductor layer including under said drain region; and
a body region, doped said second conductivity type, that is located between said source region and said drain region and extends between the drain region and the second partial buried layer.

2. The LDMOS device of claim 1, wherein said drift region and said DWELL region are formed within said body region.

3. The LDMOS device of claim 1, wherein said first partial buried layer is a blanket layer and said second partial buried layer is a localized layer having a doping level sufficiently high to counterdope a doping level in said first partial buried layer.

4. The LDMOS device of claim 1, wherein said second partial buried layer is a blanket layer and said first partial buried layer is a localized layer having a doping level sufficiently high to counterdope a doping level in said second partial buried layer.

5. The LDMOS device of claim 1, further comprising a plurality of field plates (FPs) in a staggered FP arrangement selected from said gate electrode and at least one metal layer, wherein said staggered FP arrangement comprises said FPs being staggered relative to one another with each said FP overlapping a larger portion of said drift region as its vertical distance to said drift region increases.

6. The LDMOS device of claim 1, wherein said LDMOS device comprises an NLDMOS device.

7. The LDMOS device of claim 1, wherein said LDMOS device comprises a PLDMOS device.

8. The LDMOS device of claim 1, wherein said substrate comprises silicon, wherein said gate dielectric layer comprises silicon oxide or silicon oxynitride (SiON) and wherein said gate electrode comprises polysilicon.

9. The LDMOS device of claim 1, wherein said LDMOS device comprises a first LDMOS device and a second LDMOS device, said first LDMOS device having a different said partial buried layer compared to said second LDMOS device.

10. An electronic device, comprising:
a substrate having a semiconductor layer thereover;
a doped buried layer within said semiconductor layer, said doped buried layer having a first buried layer region doped a first conductivity type and an adjacent second buried layer region doped a second conductivity type;
a drain region and a source region located within said semiconductor layer and having said first conductivity type;
a drift region, doped said first conductivity type, and located between said source region and said drain region; and
a body region, doped said second conductivity type, and located between said source region and said drain region and between said first buried layer region and said drain region.

11. The device of claim 10, wherein said body region doped said second dopant type and is in direct contact with said first buried layer region and located directly vertically between said drift region and said first buried layer region.

12. The device of claim 11, wherein said body region is in direct contact with said second buried layer region.

13. The device of claim 10, wherein said buried layer is located directly on a buried oxide layer.

14. The device of claim 10, further comprising a gate stack located adjacent said drain region and including a gate dielectric layer located directly on said drift region, said body region, and on a trench isolation structure that separates the body region from the drain region.

15. The device of claim 14, wherein said gate stack and trench isolation structure have a racetrack configuration with parallel first and second sides, and the drain region extends from a first side of the trench isolation structure to a second side of the trench isolation structure.

16. The device of claim 14, wherein said gate stack is located over said second buried layer region.

17. The device of claim 14, further comprising a first field plate (FP) located over said gate stack and a second FP located between said first FP and said gate stack, wherein said first FP extends laterally over said substrate past an and of said second FP.

18. The device of claim 10, wherein a portion of said body region and a portion of said drift region are located between said source region a trench isolation structure that touches the drain region.

19. The device of claim 10, wherein said second buried layer region comprises a blanket layer of said second conductivity type, and said first buried layer region comprises a portion of said blanket layer counterdoped to said first conductivity type.

20. The device of claim 10, wherein said first conductivity type is N-type and said second conductivity type is P-type.

21. An electronic device, comprising:
a substrate having a semiconductor layer thereover;
a doped buried layer within said semiconductor layer, said doped buried layer having a first buried layer region doped a first conductivity type and an adjacent second buried layer region doped a second conductivity type;
a drain region and a source region located within said semiconductor layer and having said first conductivity type;
a gate electrode and a gate dielectric located over the second buried layer region;
a first doped region having the first conductivity type extending from the gate dielectric to the drain region; and
a second doped region having the second conductivity type that touches the gate dielectric and is located vertically directly between first buried layer region and the drain region.

22. The device of claim 21, wherein the drain region is located within a shallow well region, and a shallow trench isolation (STI) structure separates the drain region from the first doped region, and a boundary between the shallow well and the first doped region ends at the STI structure.

23. The device of claim 22, wherein the gate electrode overlaps STI structure.

* * * * *